(12) United States Patent
Kwon et al.

(10) Patent No.: US 10,985,530 B2
(45) Date of Patent: Apr. 20, 2021

(54) TUNABLE SEMICONDUCTOR LASER AND OPERATION METHOD THEREOF

(71) Applicant: Electronics and Telecommunications Research Institute, Daejeon (KR)

(72) Inventors: O-Kyun Kwon, Daejeon (KR); Namje Kim, Daejeon (KR); Miran Park, Daejeon (KR); Tae-Soo Kim, Daejeon (KR); Shinmo An, Daejeon (KR); Won Seok Han, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 2 days.

(21) Appl. No.: 16/539,665

(22) Filed: Aug. 13, 2019

(65) Prior Publication Data

US 2020/0212653 A1 Jul. 2, 2020

(30) Foreign Application Priority Data

Dec. 31, 2018 (KR) .................. 10-2018-0173892

(51) Int. Cl.
*H01S 5/125* (2006.01)
*H01S 5/065* (2006.01)
*H01S 5/34* (2006.01)
*H01S 5/042* (2006.01)

(52) U.S. Cl.
CPC ............ *H01S 5/125* (2013.01); *H01S 5/0651* (2013.01); *H01S 5/34* (2013.01); *H01S 5/0427* (2013.01)

(58) Field of Classification Search
CPC .......... H01S 5/125; H01S 5/0651; H01S 5/34; H01S 5/0427; H01S 5/0612; H01S 5/0617; H01S 5/062; H01S 5/0626; H01S 5/06233; H01S 5/0625; H01S 5/06253; H01S 5/06256; H01S 5/06821; H01S 5/02453
See application file for complete search history.

(56) References Cited

U.S. PATENT DOCUMENTS

| 6,678,289 | B2 | 1/2004 | Kim |
| 7,130,325 | B2 | 10/2006 | Oh et al. |
| 7,406,267 | B2 | 7/2008 | Mahgerefteh et al. |
| 7,505,694 | B2 | 3/2009 | Johnson et al. |
| 7,809,280 | B2 | 10/2010 | Mahgerefteh et al. |

(Continued)

FOREIGN PATENT DOCUMENTS

| JP | 2015103620 A | 6/2015 |
| KR | 20030073412 A | 9/2003 |

(Continued)

*Primary Examiner* — Armando Rodriguez
(74) *Attorney, Agent, or Firm* — Rabin & Berdo, P.C.

(57) ABSTRACT

Provided is a tunable semiconductor laser including an active gain region in which an optical signal is generated according to a modulation signal, a mode control region in which a resonant mode is controlled according to a mode control signal, and a signal chirp of the optical signal is compensated according to a first compensation signal determined based on the modulation signal, and a distributed Bragg reflector (DBR) region in which an oscillation wavelength of the optical signal is determined based on a wavelength selection signal for the optical signal, a second compensation signal for compensating for a thermal chirp of the optical signal on a basis of the modulation signal, and a heater signal provided to a heater electrode.

14 Claims, 7 Drawing Sheets

(56) References Cited

U.S. PATENT DOCUMENTS

| | | |
|---|---|---|
| 8,953,650 B2 | 2/2015 | Ikagawa et al. |
| 2003/0108081 A1 | 6/2003 | Ryu et al. |
| 2005/0123300 A1 | 6/2005 | Kim et al. |
| 2010/0158056 A1 | 6/2010 | Shin et al. |
| 2018/0054038 A1 | 2/2018 | Kim |
| 2020/0176950 A1* | 6/2020 | Lee .................... H01S 5/06246 |

FOREIGN PATENT DOCUMENTS

| | | |
|---|---|---|
| KR | 20040094190 A | 11/2004 |
| KR | 20100072534 A | 7/2010 |

* cited by examiner

TUNABLE SEMICONDUCTOR LASER AND OPERATION METHOD THEREOF

CROSS-REFERENCE TO RELATED APPLICATIONS

This U.S. non-provisional patent application claims priority under 35 U.S.C. § 119 of Korean Patent Application No. 10-2018-0173892, filed on Dec. 31, 2018, the entire contents of which are hereby incorporated by reference.

BACKGROUND

The present disclosure herein relates to a tunable semiconductor laser and an operation method thereof, and more particularly, to a tunable semiconductor laser operating in a burst mode and compensating for a signal chirp, and an operation method thereof.

An optical communication network technology is widely used as a communication tools of a large capacity and a high efficiency. The optical communication technology includes a time division multiplexing (TDM) technology for increasing an individual channel speed, and a wavelength division multiplexing (WDM) technology for densely using a plurality of optical frequency resources.

Nowadays, the international standardization organization (ISO) adopts a Next-Generation Passive Optical Network 2 (NG-PON2) as a standard scheme (G.989.2) of a wired access subscriber network technology to cope with rapidly growing next generation multimedia services. The NG-PON2 uses a time wavelength division multiplexing (TWDM) scheme in which a WDM technology is applied to an existing TDM scheme technology in which a plurality of subscribers use one wavelength and thus a plurality of subscribers may use a plurality of wavelength channels. A device for implementing the TWDM scheme is required to be able to transfer data at a high speed and set a wavelength channel rapidly.

SUMMARY

The present disclosure provides a tunable semiconductor laser operating in a burst mode and compensating for a signal chirp, and an operation method thereof.

An embodiment of the inventive concept provides a tunable semiconductor laser including: an active gain region in which an optical signal is generated according to a modulation signal; a mode control region in which a resonant mode is controlled according to a mode control signal, and a signal chirp of the optical signal is compensated according to a first compensation signal determined based on the modulation signal; and a distributed Bragg reflector (DBR) region in which an oscillation wavelength of the optical signal is determined based on a wavelength selection signal for the optical signal, a second compensation signal for compensating for a thermal chirp of the optical signal on a basis of the modulation signal, and a heater signal provided to a heater electrode.

In an embodiment of the inventive concept, an operation method of a tunable semiconductor laser comprising an active gain region, a mode control region, a DBR region, and a signal provider, comprised: providing, by the signal provider, the active gain region with a modulation signal; providing, by the signal provider, the mode control region with a mode control signal; providing, by the signal provider, the DBR region with a wave selection signal; determining, by the signal provider, a heater signal for maintaining constant a temperature of the tunable semiconductor laser on a basis of the modulation signal, the mode control signal, and the wavelength selection signal; and providing, by the signal provider, the mode control region with a first compensation signal determined based on the modulation signal and configured to compensate a signal chirp.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, an exemplary embodiment of the present disclosure will be described in detail with reference to the accompanying drawings such that a person skilled in the art may easily carry out the embodiments of the present disclosure. In the inventive concept, a layer, a section, and a unit may be terms corresponding to each other.

In an embodiment of the inventive concept, a chirp may refer to a transition in an optical signal. The chirp may include a signal chirp and a thermal chirp. The signal chirp may occur due to current injection in a laser and a refractive index change in a laser, and include a transient chirp and an adiabatic chirp. The thermal chirp may occur according to an increase in temperature in the laser. A tunable semiconductor laser according to an embodiment of the inventive concept may adjust chirps including a signal chirp and a thermal chirp. The signal chirp will be described in more detail with reference to FIGS. 3 and 4.

Figure 1:
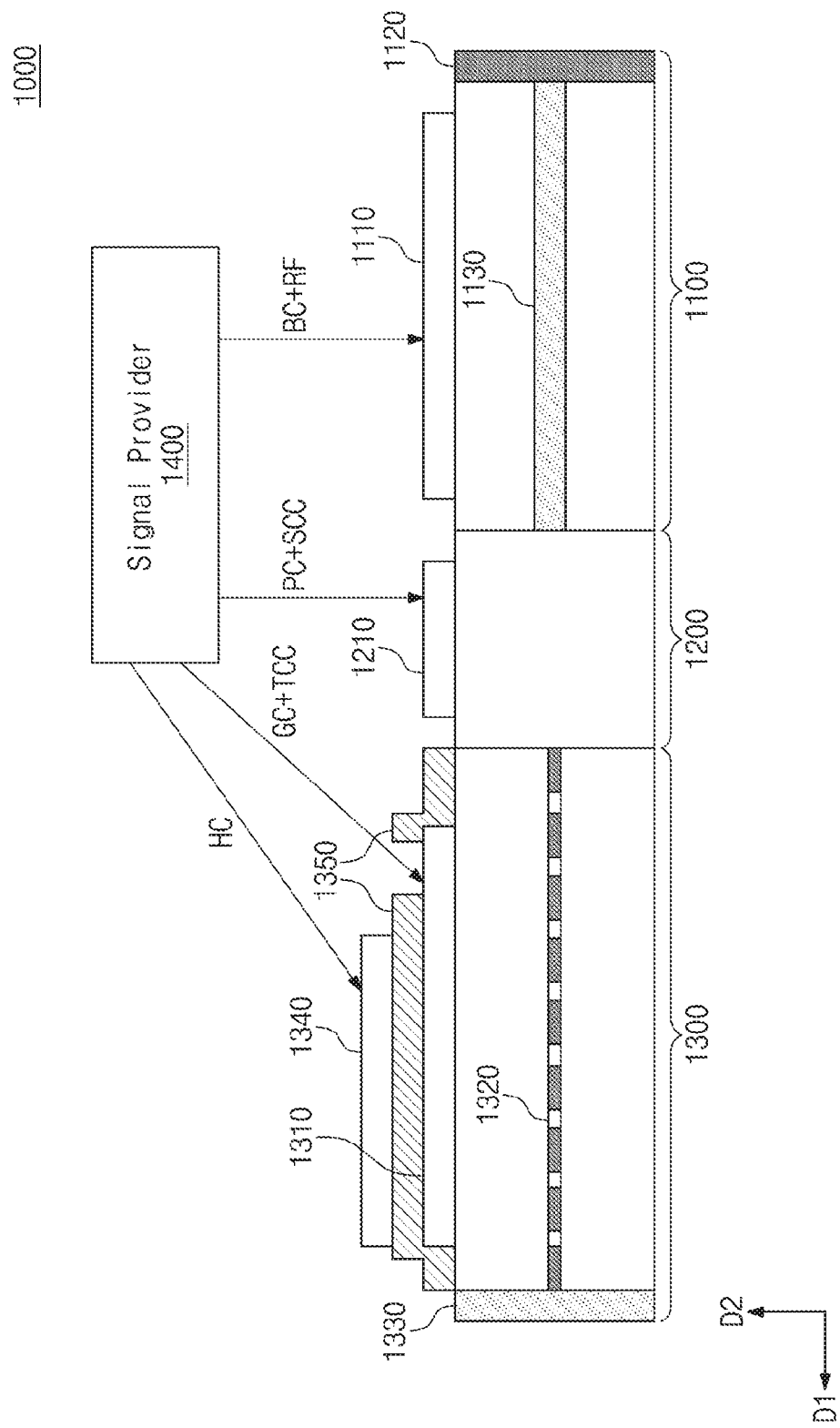
FIG. 1 is a configuration diagram showing a tunable semiconductor laser according to an embodiment of the inventive concept.

FIG. 1 is a configuration diagram showing a tunable semiconductor laser 1000 according to an embodiment of the inventive concept. FIG. 1 may show a cross section of the tunable semiconductor laser 1000 in a D1-D2 plan view. The tunable semiconductor laser 1000 may operate in a burst mode and be a tunable light source device or a laser resonator that may control a chirp. Here, the burst mode may refer to a mode in which a temperature of the tunable semiconductor laser 1000 is maintained constant. The tunable semiconductor laser 1000 may be a distributed Bragg reflector (DBR) laser.

The tunable semiconductor laser 1000 may include an active gain region 1100, a mode control region 1200, a DBR region 1300, and a signal provider 1400. Each signal BC, RF, PC, SCC, GC, or TCC will be described below together with the active gain region 1100, the mode control region 1200, the DBR region 1300, and the signal provider 1400.

In the active gain region 1100, an optical signal is directly modulated by current injection so that the tunable semiconductor laser 1000 operates in a burst mode and a chirp is controllable. An optical signal may be generated according to a modulation signal in the active gain region 1100. The active gain region 1100 may be provided with (or receive) the modulation signal including a bias signal BC and an input signal RF. The modulation signal may be the sum of the bias signal BC and the input signal RF. For example, the bias signal BC, the input signal RF, and the modulation signal may be currents. When the bias signal BC, the input signal RF, and the modulation signal are currents, the active gain region 1100 may be provided with the bias signal BC, the input signal RF, and the modulation signal in a current injection manner. The active gain region 1100 may include an active gain electrode 1110, a reflection coating surface 120, a multi-quantum well (MQW) layer 1130. The active gain region 1100 may further include a semiconductor layer constituted of a p-type semiconductor and an n-type semiconductor. The MQW layer 1130 may be implemented with a typical compound semiconductor, and may be inserted between the p-type semiconductor and the n-type semiconductor.

The active gain electrode 1110 may be electrically insulated by a dielectric material (e.g., passivation BCB) for a high speed operation. The active gain electrode 1110 may be provided with a modulation signal including the bias signal BC and the input signal RF in order to directly modulate an optical signal in a current injection manner. The active gain electrode 1110 may be a metal electrode ohmically contacted in a semiconductor electrode layer of the active gain region 1100 in order to modulate the optical signal. In other words, a contact between the active gain electrode 1110 and the semiconductor electrode layer of the active gain region 1100 may be an ohmic contact. The reflection coating surface 1120 may amplify the magnitude (or the level) of an optical signal emitted in a D1 direction from the tunable semiconductor laser 1000.

Modes and cavities of the tunable semiconductor laser 1000 may be dynamically controlled in the mode control region 1200. When a mode (including the burst mode and various resonant modes, etc.) and an oscillation wavelength of the tunable semiconductor laser 1000 are unmatched, the mode and the oscillation wavelength of the tunable semiconductor laser 1000 may be matched in the mode control region 1200. Here, the oscillation wavelength may be a wavelength of an optical signal emitted from the tunable semiconductor laser 1000. The mode control region 1200 may include a mode control electrode 1210. The mode control region 1200 and the mode control electrode 1210 may be also referred to as a phase control region and a phase control electrode, respectively.

Modes of the tunable semiconductor laser 1000 may be changed according to operation environments of the regions 1100, 1200, and 1200 of the laser. The mode control electrode 1210 may match modes in the laser resonator and a standard wavelength so that oscillation occurs at a wavelength regulated by the International Telecommunication Union Telecommunication Standardization Sector (ITU-T) grid. The mode control region 1200 may be provided with, through the mode control electrode 1210, not only the mode control signal PC but also a signal chirp compensation signal SCC determined based on the input signal RF provided to the active gain electrode 1110. When modes in the laser resonator and the oscillation wavelength of the laser resonator are unmatched, modes in the laser resonator and the oscillation wavelength of the laser resonator may be matched by the mode control signal PC provided through the mode control electrode 1210 in the mode control region 1200.

In the mode control region 1200, an internal mode fluctuation and the oscillation wavelength of the tunable semiconductor laser 1000 may be stabilized by the signal chirp compensation signal SCC provided through the mode control electrode 1210, and a signal chirp that is generated by the modulation signal provided to the active gain region 1100, may be controlled or compensated. In the mode control region 1200, a resonant mode may be controlled according to a mode control signal, and a signal chirp may be adjusted according to the signal chirp compensation signal determined based on the modulation signal. In other words, the mode control region 1200 may be provided with the signal chirp compensation signal SCC through the mode control electrode 1210 in order to compensate for instability in the tunable semiconductor laser 1000. The sum of the mode control signal PC and the signal chirp compensation signal SCC may be referred to as a dynamic mode control signal. For example, the mode control signal PC and the signal chirp compensation signal SCC may be currents. In this example, the mode control region 1200 is provided with the mode control signal PC and the signal chirp compensation signal SCC in a current injection manner. The mode control signal PC and the signal chirp compensation signal SCC will be described more specifically with reference to FIGS. 7 and 8.

In the DBR region 1300, the wavelength of the optical signal may be controlled, and the burst mode and the thermal chirp may be controlled. The DBR region 1300 may also be referred to as a wavelength control region, a wavelength selection region, or a grating wavelength control part. The DBR region 1300 may be provided with the heater signal HC, the wavelength selection signal GC, and the thermal chirp compensation signal TCC. The heater signal HC, the wavelength selection signal GC, and the thermal chirp compensation signal TCC may be currents. When the heater signal HC, the wavelength selection signal GC, and the thermal chirp compensation signal TCC are currents, the DBR region 1300 may be provided with the heater signal HC, the wavelength selection signal GC, and the thermal chirp compensation signal TCC in a current injection manner. In the DBR region 1300, the oscillation wavelength may be determined based on a wavelength selection current, the thermal chirp compensation signal determined based on the modulation signal and compensating for the thermal chip, and the heater signal supplied to the heater electrode.

In the DBR region 1300, the oscillation wavelength of the tunable semiconductor laser 1000 may be determined. The oscillation wavelength may be also referred to as an emission wavelength, a grating output wavelength, an operation wavelength, and a resonance wavelength. An optical signal having an oscillation wavelength may be emitted in the D1 direction in the DBR region 1300. In the DBR region 1300, a rapid wavelength conversion speed (e.g. 10 μsec or lower in class 1 of NG-PON2) of the tunable semiconductor laser 100 may be maintained by the wavelength selection signal GC. In the DBR region 1300, a resonant mode may be determined by an effective refractive index of the tunable semiconductor laser 100 at the oscillation wavelength, and light may be oscillated in the mode matched with the oscillation wavelength. Here, the effective refractive index may be the total sum of refractive indexes in the tunable semiconductor laser 1000.

The DBR region 1300 may include a DBR electrode 1310, a DBR grating 1320, an anti-reflection coating surface 1330, a heater electrode 1340, and an insulator 1350. The anti-reflection coating surface 1330 may amplify the magnitude of the optical signal to be emitted in D1 direction from the DBR region 1300. The DBR grating 1320 may determine a resonant mode by means of an effective refractive index of the tunable semiconductor layer 1000 at an oscillation wavelength, and light may be oscillated in a resonant mode with which the oscillation wavelength is matched. The insulator 1350 may be positioned between the DBR electrode 1310 and the heater electrode 1340 in the DBR region 1300. The insulator 1350 may electrically block the DBR electrode 1310 and the heater electrode 1340. The insulator 1350 may be disposed on the DBR electrode 1310 and the heater electrode 1340 may be disposed on the insulator 1350.

The DBR electrode 1310 may be referred to as a wavelength adjustment electrode, a wavelength selection electrode, a DBR selection electrode, and a DBR control electrode. The DBR region 1300 may be provided with a wavelength selection signal GC and a thermal chirp compensation signal TCC through the DBR electrode 1310. The heater 1340 may be provided with a heater signal HC. The heater electrode 1340 may be referred to as a heater or a micro-heater. For a burst mode operation, the heater electrode 1340 may compensate for a temperature change of the tunable semiconductor laser 1000 during turn-on and turn-off operations of the tunable semiconductor laser 1000. The heater signal HC will be more specifically described with reference to FIGS. 5 and 6, and the thermal chirp compensation signal TCC will be more specifically described with reference to FIGS. 9 to 12.

The signal provider 1400 may provide signals to the active gain region 1100, the mode control region 1200 and the DBR region 1300. In other words, the signal provider 1400 may provide the active gain region 1100 with a modulation signal including a bias signal BC and an input signal RF. The signal provider 1400 may provide, at the same time or at different times, the bias signal BC, the input signal RF, the mode control signal PC, the signal chirp compensation signal SCC, the wavelength selection signal GC, the thermal chirp compensation signal TCC, and the heater signal HC. A method in which the signal provider 1400 determines the bias signal BC, the input signal RF, the mode control signal PC, the signal chirp compensation signal SCC, the wavelength selection signal GC, the thermal chirp compensation signal TCC, and the heater signal HC will be described more specifically with reference to FIG. 2.

In an embodiment, the signal provider 1400 may be implemented with a dedicated circuit (for example, field programmable gate arrays (FPGA), application specific integrated circuits (ASICs), or the like), or a system on chip (SoC). For example, the signal provider 1400 may include a general purpose processor, a dedicated processor, or an application processor. The signal provider 1400 may be a processor itself, or an electronic device or a system including the processor.

In an embodiment, the bias signal BC, the input signal RF, the mode control signal PC, the signal chirp compensation signal SCC, the wavelength selection signal GC, the thermal chirp compensation signal TCC, and the heater signal HC are supplied from the signal provider 1400, which is a single device, but are not necessarily limited thereto. In the tunable semiconductor laser 1000, a device for providing the bias signal BC, the input signal RF, the mode control signal PC, the signal chirp compensation signal SCC, the wavelength selection signal GC, the thermal chirp compensation signal TCC, and the heater signal HC may be implemented in plurality. For example, each of the bias signal BC, the input signal RF, the mode control signal PC, the signal chirp compensation signal SCC, the wavelength selection signal GC, the thermal chirp compensation signal TCC, and the heater signal HC may be provided by an individual and stand-alone device.

In an embodiment of the inventive concept, the signal chirp compensation signal SCC and the thermal chirp compensation signal TCC may be classified according to a type of a chirp. However, both the signal chirp compensation signal SCC and the thermal chirp compensation signal TCC may be referred to as compensation signals. In this case, the signal chirp compensation signal SCC and the thermal chirp compensation signal TCC may be referred to as a first compensation signal and a second compensation signal according to a chirp type.

The signal provider 1400 is not limited to be necessarily included in the tunable semiconductor laser 1000. For example, the signal provider 1400 may be separately disposed outside the semiconductor laser 1000 as a separate device from the tunable semiconductor laser 1000. Further, the other above-described configurations 1100, 1200, and 1300 may be respectively provided as individual elements or components, or may be provided in one integrated chip or in individual chips. The tunable semiconductor laser 1000 may include the active gain region 1100, the mode control region 1200, and the DBR region 1300 on the basis of an Indium Gallium Arsenide Phosphide (InGaAsP) compound semiconductor on an Indium Phosphide (InP) substrate including an insulator constituted from passivation Benzocyclobutene (BCB).

Figure 2:
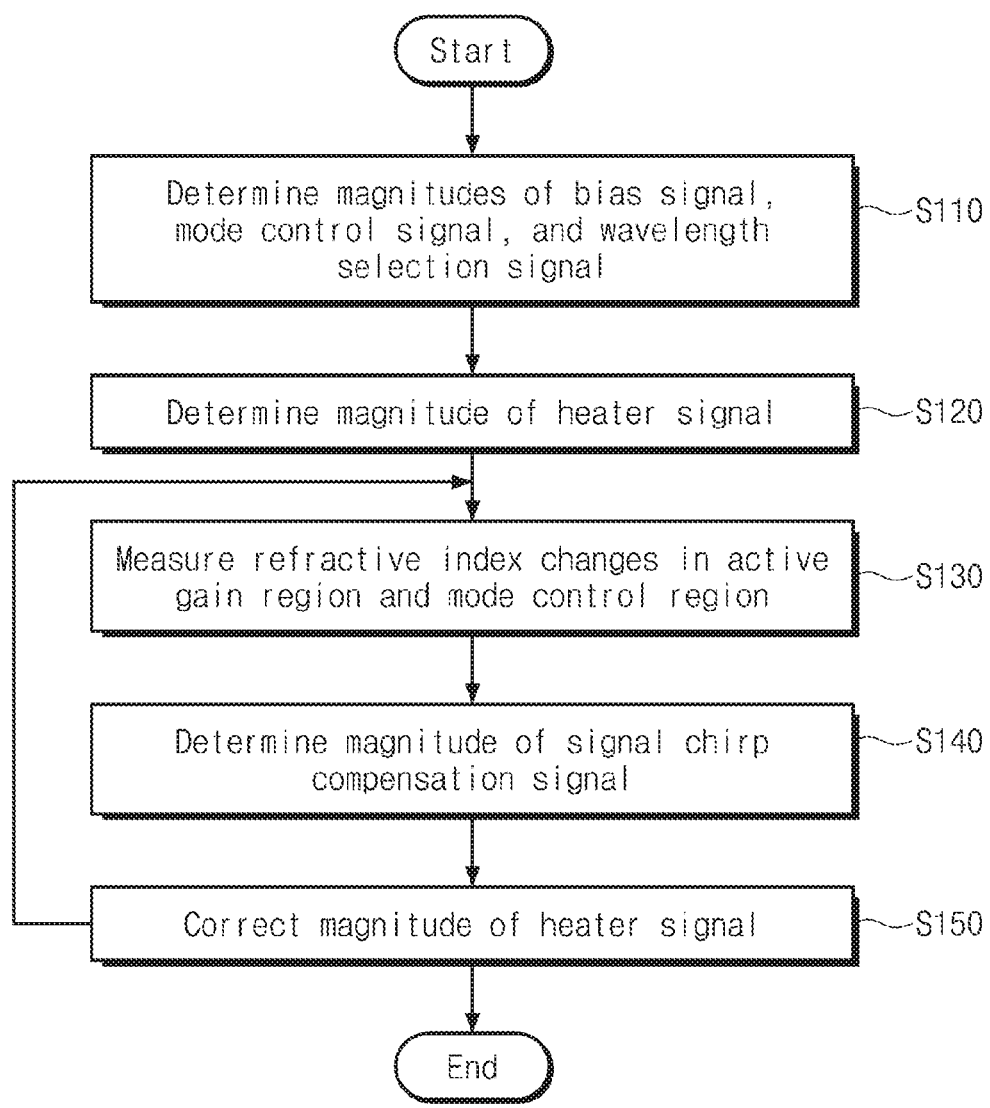
FIG. 2 is a flowchart showing an operation method of the tunable semiconductor laser of FIG. 1.

FIG. 2 is a flowchart showing an operation method of the tunable semiconductor laser of FIG. 1. The operation method of the tunable semiconductor laser may be an operation method of a tunable light source device that operates in a burst mode and is capable of controlling the chirp.

In operation S110, the signal provider 1400 may determine the magnitudes of the bias signal BC, the mode control signal PC, and the wavelength selection signal GC. The signal provider 1400 may determine the magnitudes of the bias signal BC, the mode control signal PC, and the wavelength selection signal GC so as to set a specific wavelength corresponding to the ITU-T grid under an environment and a condition in which the tunable semiconductor laser 1000 operates.

In operation S120, the signal provider 1400 may determine the magnitude of the heater signal HC. The signal provider 1400 may determine the heater signal HC so at to maintain the temperature of the tunable semiconductor laser 1000 constant on the basis of the modulation signal including the bias signal BC and the input signal RF, the mode control signal PC, and the wavelength selection signal GC. The bias signal BC and the mode control signal PC injected to the tunable semiconductor laser 1000 may change the temperature and the oscillation wavelength of the DBR grating 1320 in the tunable semiconductor laser 1000 by means of Joule heating and Ohmic heating. Accordingly, the signal provider 1400 may measure a wavelength deviation of the DBR grating 1320 due to the bias signal BC, the mode control signal PC, and the wavelength selection signal GC. The signal provider 1400 may measure the wavelength deviation of the DBR grating 1320 on the basis of a response from the DBR region 1300, which corresponds to the signals GC and TCC provided to the DBR region 1300. The signal provider 1400 may determine the magnitude of the heater signal HC according to the heat capacity induced by the bias signal BC and the mode control signal PC on the basis of the wavelength deviation of the DBR grating 1320. While the tunable semiconductor laser 1000 is turned off, the heater signal HC is provided to the heater electrode 1340 in the DBR region 1300, and while the tunable semiconductor laser 1000 is turned on, the heater signal is not provided thereto. Accordingly, the signal provider 1400 may maintain the temperature of the tunable semiconductor laser 100 constant.

In operation S130, the tunable semiconductor laser 1000 may measure changes in refractive indexes in the active gain region 1100 and the mode control region 1200. The tunable semiconductor laser 1000 may be measured from a calculation based on the wavelength deviation of the DBR grating 1320. The changes in refractive indexes in the active gain region 1100 and the mode control region 1200 may address mode instability in the tunable semiconductor laser 1000, which is caused by the bias signal BC and the input signal RF injected to the active gain region 1100.

In an embodiment, the refractive index change in the active gain region 1100 may be induced by a magnitude and a value as much as the modulation signal including the bias signal BC and the input signal RF exceeds the bias signal BC. In addition, the refractive index change in the mode control region 1200 may be induced by a magnitude and a value as much as the sum of the mode control signal PC and the signal chirp compensation signal SCC exceeds the mode control signal PC. Here, a magnitude as much as the modulation signal exceeds the bias signal BC, and a magnitude as much as the sum of mode control signal PC and the signal chirp compensation signal SCC exceeds the mode control signal PC are only examples for showing the difference between the modulation signal and the bias signal BC and the difference between the mode control signal PC and the sum of the mode control signal PC and the signal chirp compensation signal SCC. The embodiment of the inventive concept is not limited thereto.

In operation S140, the signal provider 1400 may determine the magnitude of the signal chirp compensation signal SCC. The signal provider 1400 may determine the magnitude of the signal chirp compensation signal SCC on the basis of refractive index changes in the active gain region 1100 and the mode control region 1200. The signal provider 1400 may determine a ratio of the magnitude of a current exceeding a bias current for canceling out the refractive index changes in the active gain region 1100 and the mode control region 1200, and the magnitude of a current exceeding the mode control current. The signal provider 1400 may determine the magnitude of the signal chirp compensation signal SCC on the basis of the magnitude and value of a current exceeding the bias current and the mode control current. Since the length of a waveguide of the active gain region 1100 and the length of a waveguide of the mode control region 1200 are different from each other, the magnitude of a current exceeding the bias current and the magnitude of a current exceeding the mode control current may be different from each other. The signal provider 1400 may provide the mode control region 1200 with the signal chirp compensation signal SCC determined based on the bias signal BC and the input signal RF, and invert a code pattern of the modulation signal to determine a code pattern of the signal chirp compensation signal SCC. Accordingly, after a bit stream of the input signal RF injected to the active gain region 1100 is inverted and magnitude conversion is performed according to a magnitude as much as the ratio of an excessive current magnitude, the signal provider 1400 may synchronize a timing for providing the input signal RF with a timing for providing the signal chirp compensation signal SCC. In the end, the signal chirp compensation signal SCC may be injected to the mode control region 1200 at the same timing as the input signal RF.

In operation S150, the signal provider 1400 may correct the magnitude of the heater signal HC. The signals BC, RF, PC, SCC, GC and TCC that are supplied to the tunable semiconductor laser 1000 are not changed by the signal chirp compensation signal SCC, but a local current distribution difference in the tunable semiconductor laser 100 may occur. The difference in fine heating effect may occur in the tunable semiconductor laser 1000 due to the local current distribution difference. Accordingly, the signal provider 1400 may correct the magnitude of the heater signal HC on the basis of the bias signal BC, the mode control signal PC, the wavelength selection signal GC, and the signal chirp compensation signal SCC. The signal provider 1400 may repeat the process of correcting the magnitude of the heater signal HC.

Figure 3:
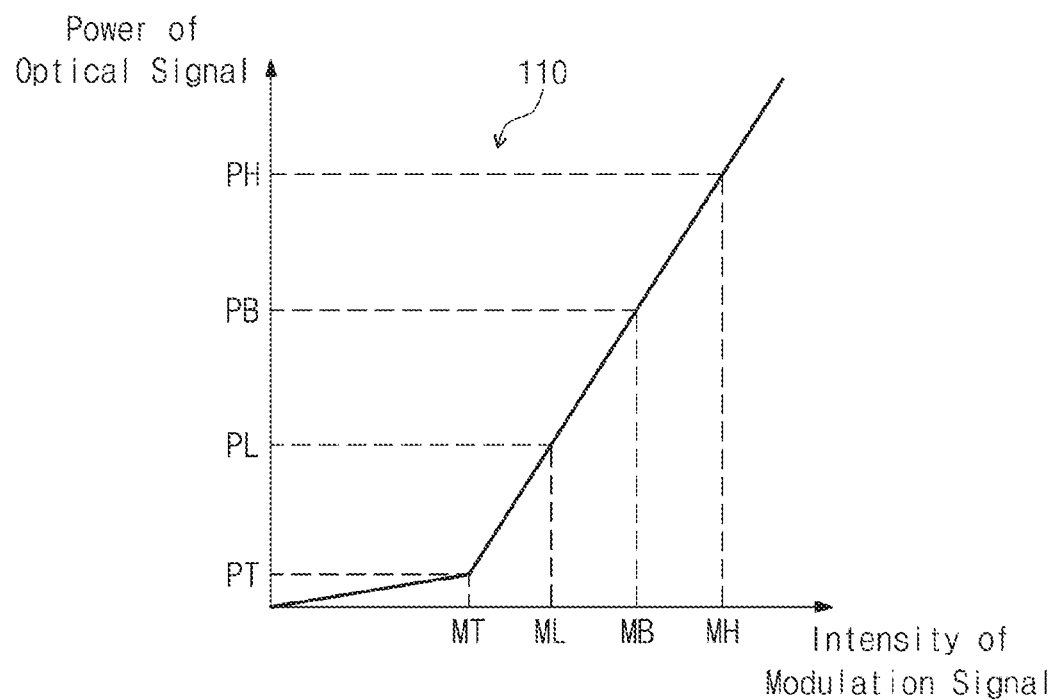
FIG. 3 is a graph showing output power of an optical signal according to the magnitude of a modulation signal in a tunable semiconductor laser of FIG. 1.
Figure 4:
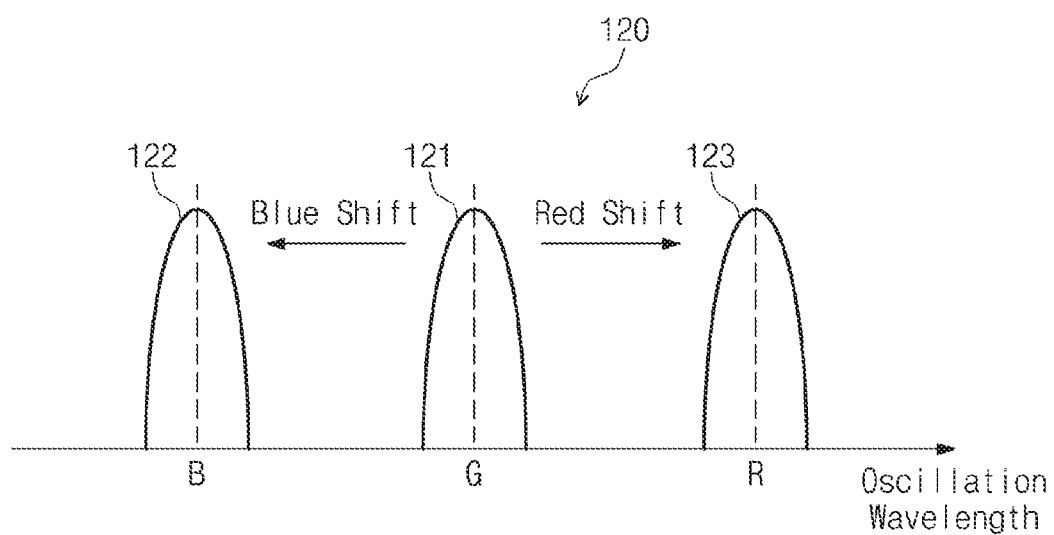
FIG. 4 is a graph showing shifts in an oscillation wavelength in a tunable semiconductor laser of FIG. 1.

FIG. 3 is a graph showing output power of an optical signal according to the magnitude of a modulation signal in the tunable semiconductor laser of FIG. 1. FIG. 4 is a graph showing shifts in an oscillation wavelength in the tunable semiconductor laser of FIG. 1. FIGS. 3 and 4 may explain a modulation operation of a distributed feedback (DFB) laser 1000. FIGS. 3 and 4 will be explained together for a transition and deviation in an oscillation wavelength in the tunable semiconductor laser 1000. FIGS. 3 and 4 will be explained with reference to FIG. 1.

In the graph 110 of FIG. 3, which indicates output power of an optical signal according to the magnitude (e.g., current level) of the modulation signal, when the magnitude of the modulation signal is MT or greater, the output power of the optical signal emitted from the tunable semiconductor laser 1000 may be PT or higher. When the output power of the optical signal is PT or higher, the tunable semiconductor laser 1000 may be turned on. When the modulation signal is injected into the tunable semiconductor laser 1000, Joule heating may be generated in the tunable semiconductor laser 100. When the tunable semiconductor laser 1000 is turned off, the modulation signal may not be injected into the tunable semiconductor laser 1000.

The magnitude of the modulation signal in FIG. 3 may vary (or fluctuate) between ML and MH around MB. In this case, MB may be the magnitude of the bias signal BC, and (ML−MB) and (MH−MB) may be respectively the minimum and maximum magnitudes of the input signal. When a bit of the input signal RF that is a bit signal is 1, the magnitude of the input signal RF may be (MH−MB), and when a bit of the input signal RF is 0, the magnitude of the input signal RF may be (ML−MB). When bits of the input signal RF are 1 and 0, the input signal RF may be in high and low states, respectively. According to a code pattern including bits of the input signal RF, when the magnitudes of the modulation signal are ML, MB, and MH respectively, the output powers of the optical signal may be PL, PB, and PH respectively.

A graph 120 in FIG. 4, which shows oscillation wavelength shifts in the tunable semiconductor laser 1000, may indicate a transition and deviation in oscillation wavelength according to Joule heating and current injection of the tunable semiconductor laser 1000. For a binary operation (or digital operation, discrete operation) of the tunable semiconductor laser 1000, when the tunable semiconductor laser 1000 is switched from a turn-on state to a turn-off state, the oscillation wavelength 121 determined by the DBR grating 1320 may be shifted, by the bias signal BC, to an oscillation wavelength 122 due to a blue shift and to an oscillation wavelength 123 due to a red shift. Shifts of the oscillation wavelength may include a red shift and a blue shift. The red shift of the oscillation wavelength may occur due to Joule heating, and the blue shift of the oscillation wavelength may occur due to an effective refractive index transition in the DBR region, which is proportional to a current amount injected into the tunable semiconductor laser 1000 during a predetermined time interval.

When the tunable semiconductor laser 1000 emits an optical signal having an oscillation wavelength through the DBR grating 1320, a wavelength transition may occur due to turn-on and turn-off operations of the tunable semiconductor laser 1000, and the wavelength transition may cause a trouble in a burst mode operation. In addition, the injection of the input signal RF, which is a binary signal including bits, may induce a change in effective refractive index and a fluctuation in resonant mode in the tunable semiconductor laser 100 due to a relative current difference. The effective refractive index change and resonant mode fluctuation may cause a signal chirp in the optical signal.

Figure 5:
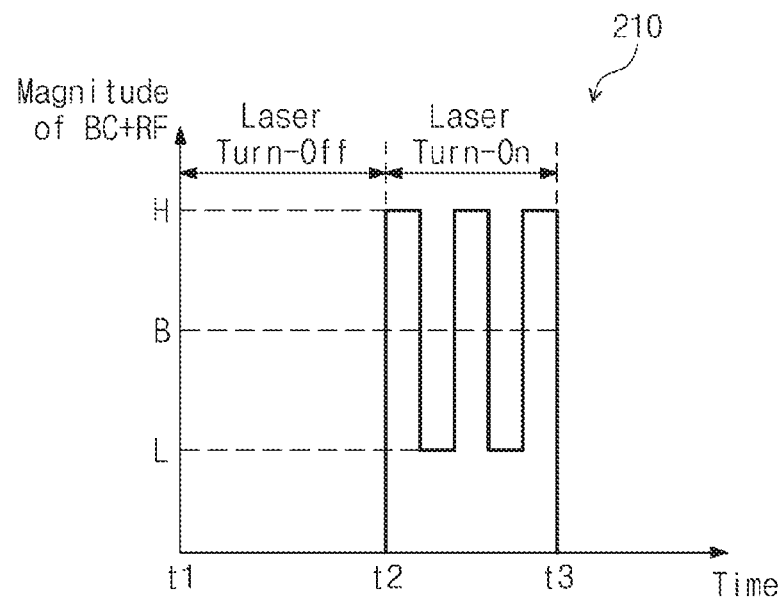
FIG. 5 is a graph showing the magnitude of a modulation signal according to the time in a tunable semiconductor laser of FIG. 1.
Figure 6:
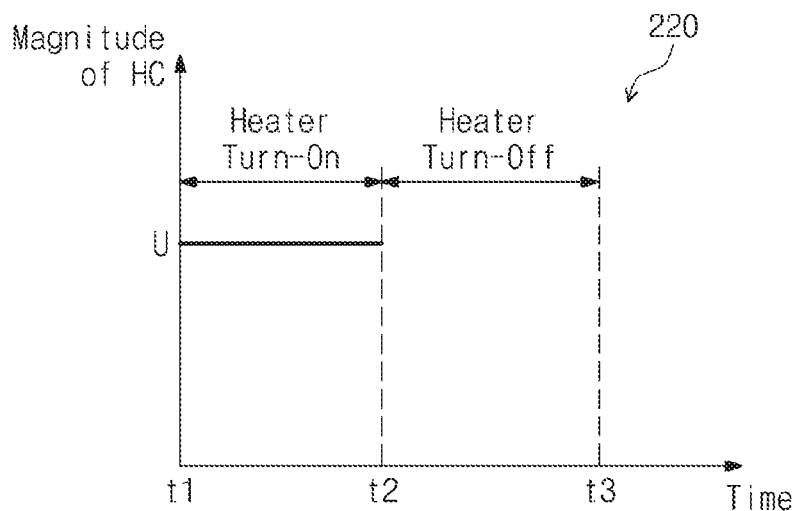
FIG. 6 is a graph showing the magnitude of a heater signal HC according to the time in a tunable semiconductor laser of FIG. 1.

FIG. 5 is a graph showing the magnitude of a modulation signal according to the time in the tunable semiconductor laser of FIG. 1. FIG. 6 is a graph showing the magnitude of the heater signal HC according to the time in the tunable semiconductor laser of FIG. 1. FIGS. 5 and 6 will be explained with reference to FIG. 1. FIGS. 5 and 6 will be explained together for a method for providing the heater signal HC to the heater electrode 1340 of FIG. 1.

In FIG. 5, the tunable semiconductor laser 1000 may be turned off during a time interval from t1 to t2, and turned on during a time interval from t2 to t3. A time interval from t1 to t3 may be repeated. During the turn-on, the signal provider 1400 may provide the active gain region 1100 with the bias signal BC and the input signal RF through the active gain electrode 1110. The magnitude of the bias signal BC may be B, and the maximum and minimum magnitudes of the input signal RF may be respectively (H−B) and (L−B). Accordingly, the maximum and minimum magnitudes of the modulation signal that is the sum of the bias signal BC and the input signal RF may be respectively H and L. B may be the average magnitude of H and L.

Under a direct current injection manner, the tunable semiconductor laser 1000 may determine an operation condition on the basis of the bias signal BC, the mode control signal PC for matching a laser resonator mode, and the wavelength selection signal GC for selecting a wavelength shift caused by Joule heating generated according to the bias signal BC and the mode control signal PC and one oscillation wavelength from among ITU-T standard wavelengths. However, when the tunable semiconductor laser 100 is switched from a turn-off state to a turn-on state, the magnitude of a control signal to be provided to the active gain electrode 1110 is set from 0 to a setting magnitude and thus consecutive changes in the oscillation wavelength may occur due to a temperature change in the tunable semiconductor laser 1000. Here, the control signal may be the bias signal BC, and the setting magnitude may be B of FIG. 5. The control signal may be referred to as a control current. The consecutive changes of the oscillation wavelength may induce a noise signal in the tunable semiconductor laser 1000.

In FIG. 6, the heater electrode 1340 may be turned on during a time interval t1 to t2 in which the tunable semiconductor laser 1000 is turned off. In addition, when the tunable semiconductor laser 1000 is switched from a turn-off state to a turn-on state, the heater electrode 1340 may be switched from a turn-on state to a turn-off state. In other words, during a time interval from t2 to t3 in which the tunable semiconductor laser 1000 is turned on, the heater electrode 1340 may be turned off. When the heater electrode 1340 is turned on, the heater electrode 1340 may be provided with the heater signal HC from the signal provider 1400. In this case, the magnitude of the heater signal HC may be, for example, U. When the heater electrode 1340 is turned off, the heater electrode 1340 may be not provided with the heater signal HC from the signal provider 1400. The heater electrode 1340 may provide the DBR region 1300 with heat capacity and a quantity of heat as much as Joule heating generated by the bias signal BC and the mode control signal PC. Due to the heat capacity provided to the DBR region 1300, a temperature of the tunable semiconductor laser 1000 may be maintained constant in both turn-off and turn-on states. The time interval t1 to t3 may be repeated.

In an embodiment, the tunable semiconductor laser 1000 may include a plurality of wavelength channels. The plurality of wavelength channels may refer to modes in which a plurality of wavelengths selected by the wavelength selection signal GC are output. For example, the tunable semiconductor laser 1000 may include four wavelength channels. When the tunable semiconductor laser 1000 includes four wavelength channels, an oscillation wavelength may be selected according to the wavelength selection signal GC provided to the DBR region. In this case, according to turn-on and turn-off operations, a noise signal may be generated between adjacent wavelength channels. The noise signal between the adjacent wavelength channels may be reduced by the heater signal HC provided to the heater electrode 1340.

Figure 7:
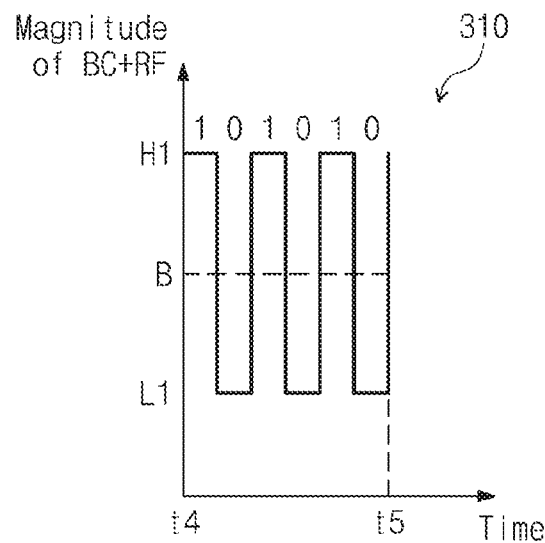
FIG. 7 is a graph showing the magnitude of a modulation signal according to the time in a tunable semiconductor laser in a turned-on state according to an embodiment of the inventive concept.
Figure 8:
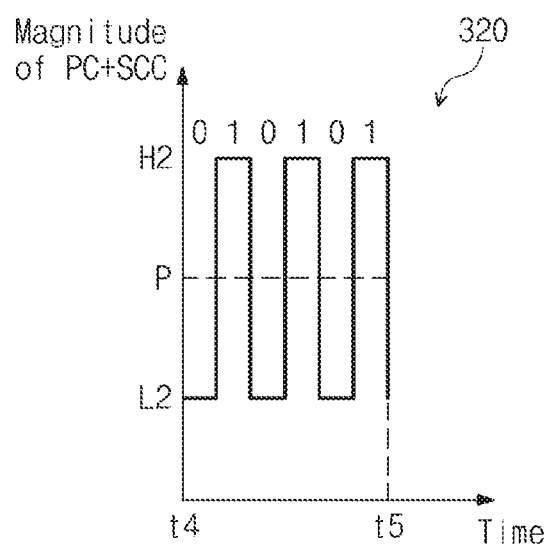
FIG. 8 is a graph showing the magnitude of the sum of a mode control signal and a signal chirp compensation signal according to the time in a tunable semiconductor laser in a turned-on state according to an embodiment of the inventive concept.

FIG. 7 is a graph showing the magnitude of a modulation signal according to the time in a tunable semiconductor laser in a turned-on state according to an embodiment of the inventive concept. FIG. 8 is a graph showing the magnitude of the sum of the mode control signal PC and the signal chirp compensation signal SCC according to the time in a tunable semiconductor laser in a turned-on state according to an embodiment of the inventive concept. FIGS. 7 and 8 will be explained together in order to explain a method for providing the signal chirp compensation signal SCC. FIGS. 7 and 8 will be explained with reference to FIG. 1. In FIGS. 7 and 8, the tunable semiconductor laser 1000 is assumed to be turned on.

In a graph 310 of FIG. 7, which shows the magnitude of a modulation signal according to the time in a tunable semiconductor laser in a turn-on state according to an embodiment of the inventive concept, the signal provider 1400 may provide the active gain region 1100 with the bias signal BC and the input signal RF through the active gain electrode 1110. The magnitude of the bias signal BC may be B, and the maximum and minimum magnitudes of the input signal RF may be respectively (H1−B) and (L1−B). Accordingly, the maximum and minimum magnitudes of a modulation signal, which is the sum of the bias signal BC and the input signal RF, may be respectively H1 and L1. B may be the average magnitude of H1 and L1. A code of the input signal RF may be a binary bit signal sequence. The signal provider 1400 may determine the pattern and the length of the code of the input signal RF. The code length of the input signal RF may be one bit or longer. The code pattern of the input signal RF may include data and information to be transmitted through an optical signal.

When a modulation signal greater than the bias signal BC is injected in a state in which a thermal effect according to the current injection is excluded, a refractive index in the active gain region 1100 may be relatively reduced. When a modulation signal smaller than the bias signal BC is injected, the refractive index in the active gain region 1100 may relatively increase. In other words, a mode of the laser resonator, which has been maintained constant by the bias signal BC, the mode control signal PC, and the wavelength selection signal GC, may repeatedly move on the basis of an oscillation wavelength according to a repetitive pattern of the input signal RF due to the input signal RF (injected current signal) and a refractive index fluctuation in the resonator. The fluctuation in resonant mode may induce a signal chirp to an output laser signal wavelength that has been photoelectrically-transformed from the input signal RF, which may cause degradation in signal transmission characteristics.

For example, when the tunable semiconductor laser 1000 includes four wavelength channels, an oscillation wavelength of the DBR region 1300 and a resonant mode wavelength of the mode control region 1200 may be matched, for each wavelength channel, with each other by the active gain signal, the mode control signal PC, and the wavelength selection signal GC. Here, the matched wavelength may be referred to as a static output wavelength. When the input signal RF is further provided to the active gain region 1100 for a dynamic operation of the tunable semiconductor laser 1000, the magnitudes of total signals for respective wavelength channels may change. Here, the injection current by a macroscopic injection current signal sequence may be in a steady state. However, a refractive index change in a waveguide of the active gain region 1100 may be induced according to the local signal patterns (a high current state when a bit is 1, and a low current state when a bit is 0) of the input signal RF. The refractive index change in the waveguide of the active gain region 1100 may cause minute and repetitive mismatches between the oscillation wavelength of the DBR region 1300 and the resonant mode wavelength of the mode control region 1200. In other words, while a bit of the input signal RF is transitioned, a minute frequency fluctuation may be income to the tunable semiconductor laser 1000, and a signal chirp component may be income thereto. Accordingly, the signal chirp compensation signal for compensating for the signal chirp is required to be provided to the mode control region 1200.

In a graph 320 of FIG. 8, which shows the magnitude of the sum of the mode control signal PC and the signal chirp compensation signal SCC according to the time in a tunable semiconductor laser in a turned-on state according to an embodiment of the inventive concept, the signal provider 1400 may provide the mode control region 1200 with the mode control signal PC and the signal chirp compensation signal SCC through the mode control electrode 1210. The magnitude of the mode control signal PC may be P, and the maximum and minimum magnitudes of the signal chirp compensation signal SCC may be respectively (H2−P) and (L2−P). Accordingly, the maximum and minimum magnitudes of the sum of the mode control signal PC and the signal chirp compensation signal SCC may be respectively H2 and L2. P may be the average magnitude of H2 and L2.

A code of the signal chirp compensation signal SCC may be a binary bit signal sequence. The signal provider 1400 may determine the code of the signal chirp compensation signal SCC on the basis of a code of a modulation signal. In other words, the signal provider 1400 may determine the pattern and the length of the code of the signal chirp compensation signal SCC on the basis of the pattern and the length of the code of the modulation signal. For example, the signal provider 1400 may determine the code length of the signal chirp compensation signal SCC so as to be the same as that of the modulation signal, and determine a code pattern of the signal chirp compensation signal SCC by inversing the code pattern of the modulation signal. The signal provider 1400 may synchronize a time for providing the input signal RF with a timing for providing the signal chirp compensation signal SCC.

In an embodiment, referring to FIG. 7, during a time interval from t4 to t5, the length and the pattern of an exemplary code of the input signal RF to be provided to the active gain region 1100 by the signal provider 1400 may be respectively 6 bits and 101010. The time interval from t4 to t5 may be repeated. When the input signal RF of a binary signal is applied, a change in refractive index may be induced in the laser resonator. For stabilizing a refractive index fluctuation in the resonator, as in FIG. 8, the signal provider 1400 may provide the mode control region 1200 with the signal chirp compensation signal SCC having the same length as the input signal RF in FIG. 7 and having a code pattern determined by inversing the code pattern of the input signal RF. Accordingly, the length and the pattern of the code of the signal chirp compensation signal SCC of FIG. 8 may be respectively 6 bits and 010101. Timings at which the input signal RF and the signal chirp compensation signal SCC are provided by the signal provider 1400 may be synchronized with each other.

A refractive index change occurring in the tunable semiconductor laser 1000 may be offset by the input signal RF and the signal chirp compensation signal SCC, and thus a refractive index state may be stabilized. In other words, a signal chirp component may be compensated with refractive index changes that are contrary between the active gain region 1100 and the mode control region 1200. Accordingly, during direct modulation through current injection, mode instability in the tunable semiconductor laser 1000 may disappear.

Figure 9:
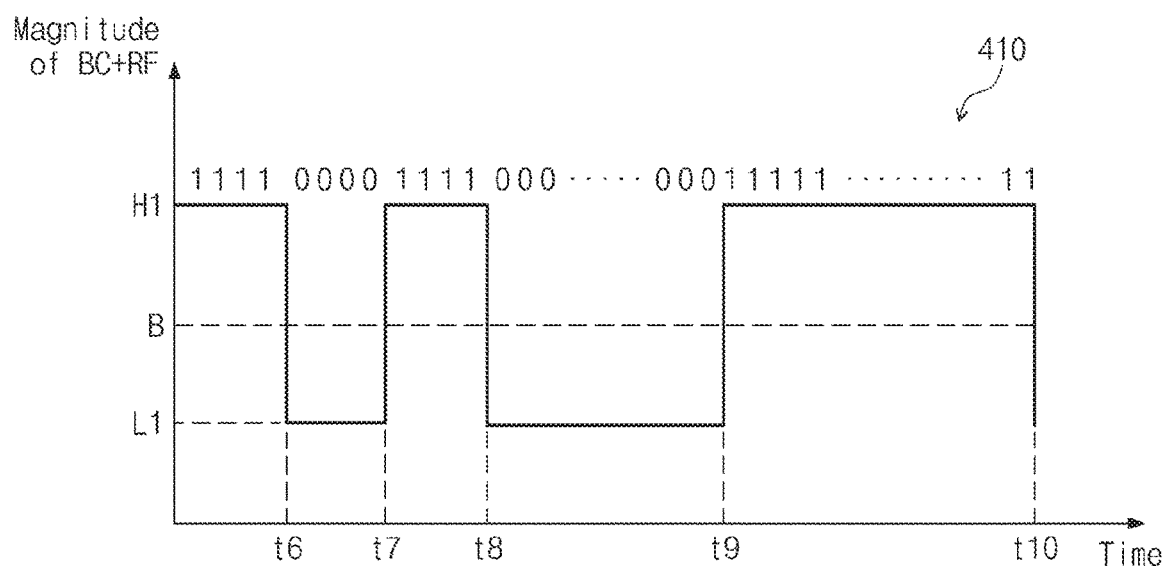
FIG. 9 is a graph showing the magnitude of a modulation signal according to the time in a tunable semiconductor laser of FIG. 1.
Figure 10:
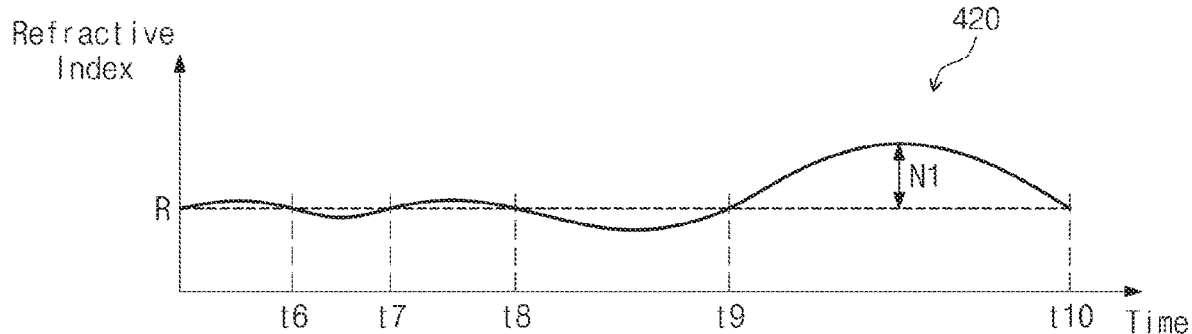
FIG. 10 is a graph showing a change in refractive index in an active gain region according to the time by a modulation signal of FIG. 9.
Figure 11:
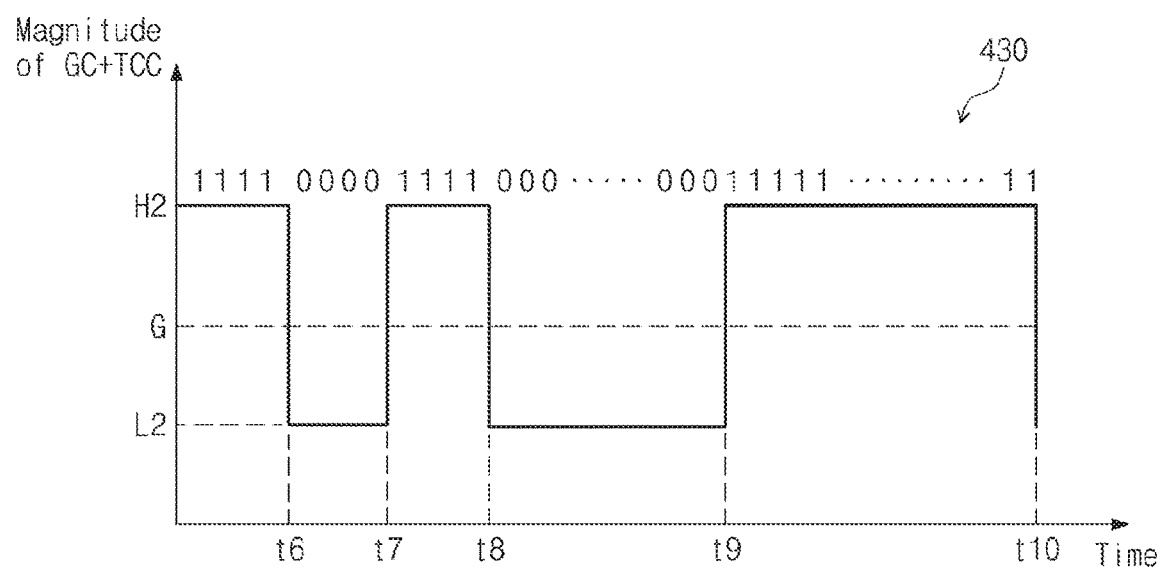
FIG. 11 is a graph showing the magnitude of the sum of a wavelength selection signal and a thermal chirp compensation signal according to the time in a tunable semiconductor laser of FIG. 1.
Figure 12:
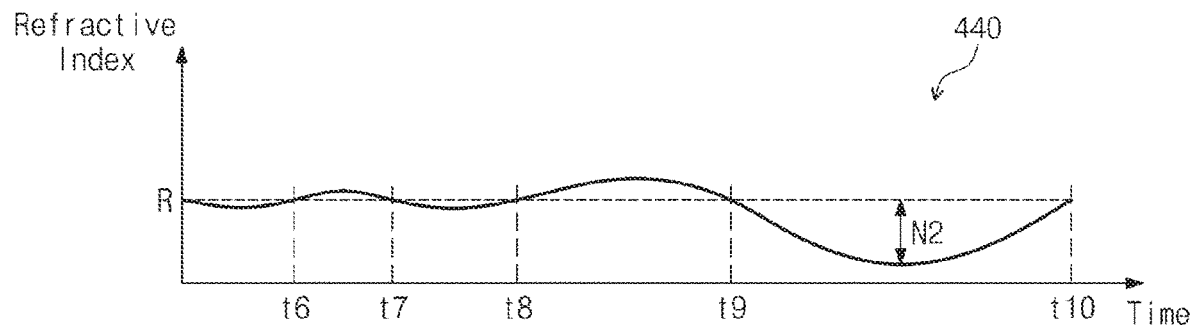
FIG. 12 is a graph showing a refractive index change in a DBR region according to the time by the sum of a wave selection signal and a thermal chirp compensation signal of FIG. 11.

FIG. 9 shows a graph showing the magnitude of a modulation signal according to the time in the tunable semiconductor laser of FIG. 1. FIG. 10 shows a graph 420 that indicates, according to the time, a refractive index change in the active gain region due to the modulation signal of FIG. 9. FIG. 11 shows a graph 430 which indicates, according to the time, the magnitude of the sum of the wavelength selection signal GC and the thermal chirp compensation signal TCC in the tunable semiconductor laser of FIG. 1. FIG. 12 shows a graph 440 which indicates, according to the time, the refractive index change due to the sum of the wavelength selection signal GC and the thermal chirp compensation signal TCC of FIG. 11. FIGS. 9 to 12 will be explained together in order to describe a method for providing the thermal chirp compensation signal TCC. FIGS. 9 to 12 will be explained with reference to FIG. 1.

The signal provider 1400 may provide the active gain region 1100 with the modulation signal of FIG. 9. The magnitude of the bias signal BC may be B, and the maximum and minimum magnitudes of the input signal RF may be respectively (H1−B) and (L1−B). Accordingly, the maximum and minimum magnitudes of the modulation signal, which is the sum of the bias signal BC and the input signal RF, may be respectively H1 and L1. B may be the average magnitude of H1 and L1. In FIG. 9, a time interval from t9 to t10 may be longer than other time intervals (e.g., t6~t7, t7~t8, t8~t9). In other words, one bit may be repeated during a long period in the code of the input signal RF (long period signal sequence). The input signal RF of FIG. 11, which is a long period signal sequence, may cause, during a time interval from t9 to t10, a greater refractive index change and a greater thermal change in comparison to other time intervals (e.g., t6~t7, t7~t8, t8~t9) in the tunable semiconductor laser 1000. Such a refractive index change and thermal change may cause a thermal chirp.

In FIG. 10, during a time interval from t9 to t10, a greater refractive index change occurs in comparison to other time intervals (e.g., t6~t7, t7~t8, t8~t9). During the time interval from t9 to t10, the maximum refractive index may be greater than a reference refractive index (R) by N1. It is difficult to predict a thermal chirp and to compensate merely with the heater signal HC and the signal chirp compensation signal SCC. Accordingly, it is necessary to provide the DBR region 1300 with a thermal chirp compensation signal TCC for compensating for the thermal chirp, together with the wave selection signal GC.

In FIG. 11, the magnitude of the wavelength selection signal GC may be G, and the maximum and minimum magnitudes of the thermal chirp signal may be respectively (H2−G) and (L2−G). Accordingly, the maximum and minimum magnitudes of the sum of the wavelength selection signal GC and the thermal chirp compensation signal TCC may be respectively H2 and L2. G may be the average magnitude of H2 and L2. The signal provider 1400 may provide the DBR region 1300 with the thermal chirp compensation signal TCC determined based on the modulation signal of FIG. 9. The signal provider 1400 may determine a code pattern and a code length of the thermal chirp compensation signal TCC so as to be the same as those of the modulation signal of FIG. 9. In addition, the signal provider 1400 may synchronize a timing for providing the input signal RF of FIG. 9 with a timing for providing the thermal chirp compensation signal TCC.

In FIG. 12, during a time interval from t9 to t10, the thermal chirp compensation signal TCC may cause a greater refractive index change in comparison to other time intervals (e.g., t6~t7, t7~t8, t8~t9) in the tunable semiconductor laser 1000 and the minimum refractive index may be lower than a reference refractive index (R) by N2 (for example, N2 is equal to N1 of FIG. 10). Therefore, the refractive index change caused by the thermal chirp compensation signal TCC may offset the refractive index change caused by the input signal RF of FIG. 10. In other words, the refractive index in the tunable semiconductor laser 1000 may be maintained constant by offsetting a red shift caused by heat and a blue shift caused by current injection in a waveguide of the DBR region 1300. In the end, regardless of a pattern type of a long period signal sequence and a period length, a minute fluctuation, which causes a thermal chirp, may be canceled out and the transmission characteristics of an oscillated optical signal may be stabilized.

A tunable semiconductor laser according to the embodiments of the inventive concept may set a wavelength channel rapidly and operate in a burst mode.

An operation method of a tunable semiconductor laser according to an embodiment of the inventive concept may reduce a signal chirp to improve signal delivery quality.

The foregoing description is about detailed examples for practicing the inventive concept. The present disclosure includes not only the above-described embodiments but also simply changed or easily modified embodiments. In addition, the present disclosure may also include technologies obtained by easily modifying and practicing the above-described embodiments.

What is claimed is:

1. A tunable semiconductor laser comprising:
   an active gain region in which an optical signal is generated according to a modulation signal;
   a mode control region in which a resonant mode is controlled according to a mode control signal, and a signal chirp of the optical signal is compensated according to a first compensation signal determined based on the modulation signal;
   a distributed Bragg reflector (DBR) region in which an oscillation wavelength of the optical signal is determined based on a wavelength selection signal for the optical signal, a second compensation signal for compensating for a thermal chirp of the optical signal on a basis of the modulation signal, and a heater signal provided to a heater electrode, and
   a signal provider configured to determine the first compensation signal based on the modulation signal, and provide the modulation signal, the mode control signal, the first compensation signal, the wavelength selection signal, the second compensation signal, and the heater signal.

2. The tunable semiconductor laser of claim 1, further comprising:
   an insulator positioned between a DBR electrode on the DBR region and the heater electrode.

3. The tunable semiconductor laser of claim 1, wherein the active gain region includes a multi-quantum well (MQW) layer.

4. The tunable semiconductor laser of claim 1, wherein the active gain region includes a reflection coating surface.

5. The tunable semiconductor laser of claim 1, wherein the DBR region includes an anti-reflection coating surface.

6. An operation method of a tunable semiconductor laser comprising an active gain region, a mode control region, a DBR region, and a signal provider, wherein the operation method comprises:
   providing, by the signal provider, the active gain region with a modulation signal;
   providing, by the signal provider, the mode control region with a mode control signal;
   providing, by the signal provider, the DBR region with a wave selection signal;
   determining, by the signal provider, a heater signal for maintaining constant a temperature of the tunable semiconductor laser on a basis of the modulation signal, the mode control signal, and the wavelength selection signal; and providing, by the signal provider, the mode control region with a first compensation signal determined based on the modulation signal and configured to compensate a signal chirp.

7. The operation method of claim 6, further comprising: providing a heater electrode on the DBR region of the tunable semiconductor laser with the heater signal, while the tunable semiconductor laser is turned off.

8. The operation method of claim 6, wherein the providing of the first compensation signal includes inversing a code pattern of the modulation signal to determine a code pattern of the first compensation signal.

9. The operation method of claim 6, wherein the providing of the modulation signal includes:

providing, by the signal provider, the active gain region with a bias signal; and providing, by the signal provider, the active gain region with an input signal.

10. The operation method of claim 9, further comprising: synchronizing, by the signal provider, a timing for providing the input signal with a timing for providing the first compensation signal.

11. The operation method of claim 9, further comprising: providing, by the signal provider, the DBR region with a second compensation signal for compensating for a thermal chirp, wherein the second compensation signal is determined based on the modulation signal.

12. The operation method of claim 11, wherein the providing of the second compensation signal includes determining a code pattern of the first compensation signal identically to a code pattern of the modulation signal.

13. The operation method of claim 11, further comprising: synchronizing, by the signal provider, a timing for providing the input signal with a timing for providing the second compensation signal.

14. The operation method of claim 6, further comprising: correcting, by the signal provider, a magnitude of the heater signal.

* * * * *